(12) United States Patent
Hishiki et al.

(10) Patent No.: US 10,453,782 B2
(45) Date of Patent: Oct. 22, 2019

(54) MULTI-ROW WIRING MEMBER FOR SEMICONDUCTOR DEVICE AND METHOD FOR MANUFACTURING THE SAME

(71) Applicant: Ohkuchi Materials Co., Ltd., Kagoshima (JP)

(72) Inventors: Kaoru Hishiki, Kagoshima (JP); Ichinori Iidani, Kagoshima (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 16/196,718

(22) Filed: Nov. 20, 2018

(65) Prior Publication Data

US 2019/0096793 A1 Mar. 28, 2019

Related U.S. Application Data

(63) Continuation of application No. PCT/JP2017/003029, filed on Jan. 27, 2017.

(30) Foreign Application Priority Data

May 20, 2016 (JP) .................................. 2016-101946

(51) Int. Cl.
*H01L 21/48* (2006.01)
*H01L 23/498* (2006.01)
(Continued)

(52) U.S. Cl.
CPC ...... *H01L 23/49822* (2013.01); *H01L 21/486* (2013.01); *H01L 23/12* (2013.01);
(Continued)

(58) Field of Classification Search
CPC . H01L 23/49822; H01L 21/486; H01L 23/12; H01L 23/49838; H01L 24/17; H01L 23/49827
(Continued)

(56) References Cited

U.S. PATENT DOCUMENTS

| 6,388,888 B1 | 5/2002 | Seko et al. |
| 2003/0045024 A1 | 3/2003 | Shimoto et al. |

(Continued)

FOREIGN PATENT DOCUMENTS

| JP | 2001-53108 | 2/2001 |
| JP | 2001-60648 | 3/2001 |

(Continued)

OTHER PUBLICATIONS

International Search Report dated Apr. 4, 2017 in International (PCT) Application No. PCT/JP2017/003029.

*Primary Examiner* — Tremesha S Willis
(74) *Attorney, Agent, or Firm* — Wenderoth, Lind & Ponack, L.L.P.

(57) ABSTRACT

A multi-row wiring member for semiconductor device configured of a plurality of wiring members arrayed in a matrix includes a permanent resist, a first plating layer forming internal terminals, a plating layer forming wiring portions and a second plating layer forming external terminals. The first plating layer is formed in the permanent resist with lower faces thereof uncovered in the bottom surface of the permanent resist. The plating layer forming wiring portions is formed on the first plating layer in the permanent resist. The second plating layer is formed in the permanent resist on partial areas within areas of the plating layer forming wiring portions, with upper faces thereof being uncovered on a top-surface side of the permanent resist. On a bottom-surface side of the permanent resist, a metal frame is formed at the margin around an aggregate of individual wiring members for semiconductor devices arrayed in a matrix.

8 Claims, 7 Drawing Sheets

(51) Int. Cl.
*H01L 23/12* (2006.01)
*H01L 23/00* (2006.01)

(52) U.S. Cl.
CPC ........ *H01L 23/49838* (2013.01); *H01L 24/17* (2013.01); *H01L 23/49827* (2013.01); *H01L 2224/16225* (2013.01); *H01L 2224/48091* (2013.01); *H01L 2224/73204* (2013.01); *H01L 2224/73265* (2013.01); *H01L 2924/181* (2013.01)

(58) Field of Classification Search
USPC .......................................................... 174/261
See application file for complete search history.

(56) References Cited

U.S. PATENT DOCUMENTS

| | | |
|---|---|---|
| 2005/0130413 A1 | 6/2005 | Shimoto et al. |
| 2008/0145967 A1 | 6/2008 | Chew et al. |
| 2009/0102043 A1 | 4/2009 | Jimmy et al. |
| 2009/0291530 A1 | 11/2009 | Jimmy et al. |
| 2010/0117200 A1 | 5/2010 | Jung et al. |
| 2010/0264526 A1 | 10/2010 | Jimmy et al. |
| 2016/0329306 A1 | 11/2016 | Chew et al. |

FOREIGN PATENT DOCUMENTS

| | | |
|---|---|---|
| JP | 2002-198462 | 7/2002 |
| JP | 2004-241526 | 8/2004 |
| JP | 2008-153622 | 7/2008 |
| JP | 2009-164594 | 7/2009 |
| JP | 2015-185619 | 10/2015 |

MULTI-ROW WIRING MEMBER FOR SEMICONDUCTOR DEVICE AND METHOD FOR MANUFACTURING THE SAME

CROSS-REFERENCE TO RELATED PATENT APPLICATIONS

This application is a continuation of PCT International Application No. PCT/JP2017/003029, filed on Jan. 27, 2017, and claims the benefit of Japanese Patent Application No. 2016-101946 filed in Japan on May 20, 2016. The contents of PCT International Application No. PCT/JP2017/003029 and Japanese Patent Application No. 2016-101946 are incorporated herein by reference.

BACKGROUND OF THE INVENTION

1) Field of the Invention

The present invention relates to a multi-row wiring member for semiconductor device for achieving flip-chip mounting of semiconductor elements thereon and a method for manufacturing the same.

2) Description of Related Art

Conventionally, of substrates for semiconductor devices, there are those of a type intended to complete a semiconductor device by peeling off a base material thereof after mounting a semiconductor element thereon and sealing the entirety with a resin, as described in Japanese Patent Application Laid-Open No. 2015-185619.

As shown in FIG. 5A, the substrate for semiconductor device described in JP Patent Application Laid-Open No. 2015-185619 is provided, on a base material 51 made of a stainless steel material or the like, with a semiconductor-element mounting portion 52a and terminal portions 52b, both of which are formed of a metal plating layer. Each of the terminal portions 52b is formed to have an internal terminal face 52b1 and an external terminal face 52b2 in a back-to-back arrangement.

On the semiconductor-element-mounting side of each of the semiconductor-element mounting portion 52a and the terminal portions 52b, an overhang 52a1 or 52b3 is formed around the upper edge thereof. On the base-material side of the semiconductor element mounting portion 52a and the terminal portions 52b, a thin film made of Au or the like is formed by plating so that the external terminal faces assure appropriate soldering in mounting of a semiconductor device to be manufactured.

Manufacturing of a semiconductor device upon use of the substrate for semiconductor device of FIG. 5A is conducted through mounting a semiconductor element 53 on the semiconductor-element mounting portion 52a, connecting electrodes of the semiconductor element 53 and the terminal portions 52b with wires 54, forming a sealing resin portion 55 by sealing the side where the semiconductor element 53 is mounted, and then peeling off the base material 51, to complete a semiconductor device (see FIGS. 5B-5D).

Also, conventionally, of substrates for semiconductor device, there are those of a type in which internal terminals, external terminals and wiring portions are formed by metal plating on a metal sheet, to be used for a semiconductor device with BGA (Ball Grid Array) structure, as described in Japanese Patent Application Laid-Open No. 2009-164594.

The substrate for semiconductor device described in JP Patent Application Laid-Open No. 2009-164594 is configured, as shown in FIG. 6A, so that, on a metal sheet 61 as a base material, formed is an external-terminal-side plating layer having external terminal portions 62, on which formed with a same shape as the external-terminal-side plating layer is an intermediate layer 63, on which further formed with the same shape as the intermediate layer 63 is an internal-terminal-side plating layer having internal terminal portions 64. This substrate for semiconductor device is configured so that the surface of the internal-terminal-side plating layer having internal terminal portions 64, which are to achieve electrical connection with a semiconductor element, is to be an uppermost surface and so that the height from the metal sheet to the uppermost surface is substantially uniform over the entirety.

In manufacturing a semiconductor device, the substrate for semiconductor device described in JP Patent Application Laid-Open No. 2009-164594 is used with a metal-sheet-side surface of the external-terminal-side plating layer being in contact with a surface of the metal sheet as external terminal faces and a farther surface of the internal-terminal-side plating layer in reference to the metal sheet being uncovered as internal terminal faces. To be specific, the following steps are to be performed; mounting a semiconductor element 65 on the internal-terminal-face side of the substrate for semiconductor device and fix it with an adhesive layer 66, connecting electrodes of the semiconductor element and internal terminal portions 64 with wires 67, forming a sealing resin portion 68 by sealing the entirety with a resin, and removing the metal sheet by dissolving it by means of etching or the like so that the back surface of the sealing resin is made uncovered along with faces of the external-terminal-side plating layer having the external terminal portions 62. After that, the following steps are to be performed; forming a solder resist layer 69 covering the entire surface of the uncovered external-terminal-side plating layer, forming openings 70 that uncovers the external terminal portions 62 alone (see FIGS. 6B-6E), and embedding solder balls into the openings 70 at which the external terminal portions 62 are uncovered, to connect the external terminal portions 62 with external equipment (see FIG. 6F).

Since the external-terminal-side plating layer having external terminal portions 62, the intermediate layer 63 and the internal-terminal-side plating layer having internal terminal portions 64 are overlaid one on another to have a same shape so that wiring portions are formed between the internal terminal portions 64 and the external terminal portions 62, the pitch of the internal terminals and the external terminals is adjustable in accordance with a design of the wiring portion in the substrate for semiconductor device described in JP Patent Application Laid-Open No. 2009-164594.

The inventors of the present application, upon repeated trial and error at the stage before introducing the present invention, have devised a wiring member for semiconductor device that enables manufacturing of a highly-reliable resin-sealed semiconductor device through a reduced number of steps and a manufacturing method for the same wiring member; the wiring member enables reduction in thickness and size of the semiconductor device, improves adhesion between a plating film that forms terminal portions and a resin, achieves uniform height of a surface of the internal-terminal-side plating layer on which the semiconductor element is to be mounted and internal terminal portions to be electrically connected with the semiconductor element, eliminates, in the manufacturing process for the semiconductor device, the step of removing the metal sheet by etching and the step of forming openings that uncover external terminal portions alone, and moderating a warpage of the sealing resin as cured.

As a result of further study and consideration, the inventors of the present application have found that this prototypal wiring member for semiconductor device and the method for manufacturing the same as devised involved problems to be improved for mass-production of semiconductor devices.

SUMMARY OF THE INVENTION

A multi-row wiring member for semiconductor device according to one embodiment mode of the present invention configured of a plurality of wiring members for semiconductor devices arrayed in a matrix includes: a permanent resist; a first plating layer, which is to become internal terminals, formed in the permanent resist with lower faces thereof being uncovered at predetermined sites in a bottom surface of the permanent resist; a plating layer that is to become wiring portions, connected with the first plating layer in the permanent resist; and a second plating layer, which is to become external terminals, formed, in the permanent resist on partial areas within areas of the plating layer that is to become wiring portions, with upper faces thereof being uncovered on a top-surface side of the permanent resist, wherein a side view of each laminated piece of the plating layers forming one of the internal terminals, one of the wiring portions, and one of the external terminals substantially has an L shape or an inverted T shape, and wherein, on a bottom-surface side of the permanent resist, a metal frame portion is formed at a site that is to be a margin around an aggregate of individual wiring members for semiconductor devices arrayed in a matrix.

A method according to one embodiment mode of the present invention for manufacturing a multi-row wiring member for semiconductor device configured of a plurality of wiring members for semiconductor devices arrayed in a matrix includes: a step of forming, on a front surface of a metal sheet, a first resist mask having pattern-A openings and of forming, on a back surface of the metal sheet, a second resist mask having an opening at a site that is to be a margin around an aggregate of individual wiring members for semiconductor devices arrayed in a matrix; a step of forming, in the pattern-A openings, a first plating layer, which is to become internal terminals, and a plating layer that is to become wiring portions, connected with the first plating layer, and of forming, in the opening at the site that is to be the margin around the aggregate of individual wiring members for semiconductor devices arrayed in a matrix, a plating layer that is to become a resist for forming a metal frame portion; a step of peeling off the first resist mask and the second resist mask formed on the respective surfaces of the metal sheet; a step of forming, on a front-surface side of the metal sheet, a third resist mask made of a permanent resist having pattern-B openings that leave uncovered partial areas within areas of the plating layer that is to become the wiring portions and of forming a fourth resist mask made of a photosensitive resist covering an entirety of the back surface of the metal sheet; a step of forming a second plating layer, which is to become external terminals, in the pattern-B openings; a step of peeling off the fourth resist mask formed on the back surface of the metal sheet; and a step of removing by etching, from a back-surface side of the metal sheet, metal except a portion covered with the plating layer that is to become a resist for forming a metal frame portion in the site that is to become the margin around the aggregate of individual wiring members for semiconductor devices arrayed in a matrix.

These and other features and advantages of the present invention will become apparent from the following detailed description of the preferred embodiments when taken in conjunction with the accompanying drawings.

BRIEF DESCRIPTION OF THE DRAWINGS

FIG. 1A is a plan view as viewed from the external-terminal side, FIG. 1B is an enlarged view of a part of FIG. 1A, FIG. 1C is a sectional view taken along A-A of FIG. 1B, FIG. 1D is a plan view that shows one example of a laminated piece of plating layers forming an internal terminal, a wiring portion and an external terminal in an individual wiring member for semiconductor device, and FIG. 1E is a sectional view of FIG. 1D.

FIG. 4A is a plan view as viewed from the semiconductor-element-mounting side, and FIG. 4B is a sectional view of FIG. 4A.

FIG. 7A is a plan view and FIG. 7B is a sectional view.

DETAILED DESCRIPTION OF THE EMBODIMENTS

Preceding the explanation of the embodiment mode, the circumstances leading up to the present invention and the function and effect of the present invention will be described.

The inventors of the present application, upon repeated trial and error at the stage before introducing the present invention, have devised a wiring member for semiconductor device that enables manufacturing of a highly-reliable resin-sealed semiconductor device through a reduced number of steps and a manufacturing method of the same wiring member; the wiring member achieves uniform height of the internal terminal surface on which the semiconductor element is to be mounted and internal terminal portions to be electrically connected with the semiconductor element, and eliminates, in the manufacturing process for the semiconductor device, the step of removing the metal sheet by etching and the step of forming openings that uncover external terminal portions alone.

Invention Devised at the Stage before Introduction of the Present Invention

Figure 7A:
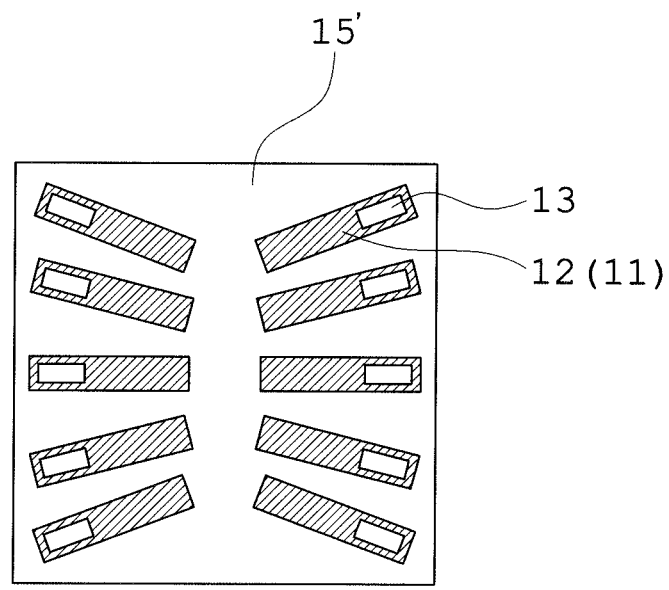
FIGS. 7A-7B are diagrams that show the configuration of the wiring member for semiconductor device according to the invention devised at the stage before introduction of the present invention, where
Figure 7B:
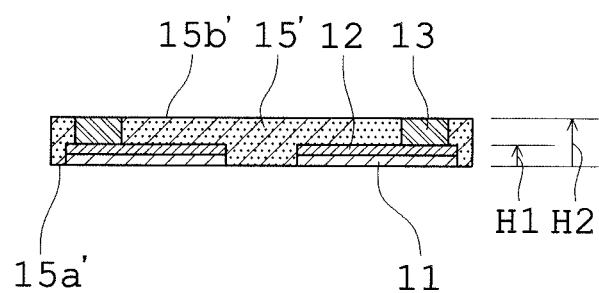

As shown in FIG. 7B, in the wiring member for semiconductor device according to the invention devised before introduction of the present invention, a first plating layer 11, which is to become internal terminals, is formed in a permanent resist 15' with lower faces thereof being uncovered at predetermined sites in a bottom surface 15a' of the permanent resist 15' at a same level as the bottom surface 15a', a plating layer 12 that is to become wiring portions is formed in the permanent resist 15' on the first plating layer 11 with plating boundaries thereof coinciding with those of the first plating layer 11, and a second plating layer 13, which is to become external terminals, is further formed on partial areas within areas of the plating layer 12 that is to become wiring portions, with upper faces thereof being uncovered on the side of the top surface of the permanent resist 15', so that a side view of each laminated piece formed of one of the internal terminals, one of the wiring portions, and one of the external terminals substantially has an L shape (or an inverted T shape).

Forming the laminated pieces of the plating layers in which the internal terminals and the external terminals are connected via the wiring portions as in the wiring member for semiconductor device according to the invention shown in FIGS. 7A-7B makes it possible to adjust the respective mounting pitches of the internal terminals and the external terminals in accordance with design.

Each laminated piece of plating layers in which an internal terminal and an external terminal are connected via a wiring portion, if formed to have substantially an L shape or an inverted T shape in a side view, is improved in adhesion to the permanent resist and thus prevents the metal film forming the terminals from coming off the permanent resist.

Also, in the configuration in which the second plating layer 13, which is to become external terminals, is formed on partial areas within areas of the plating layer 12 that is to become wiring portions, the second plating layer 13 can be made small and thus, as the external terminals left uncovered on the back surface side of the semiconductor device, is prevented from dropping or coming off.

The resin, which would be provided during the manufacturing process for a semiconductor device in the case of a conventional substrate for semiconductor device, is pre-provided in the form of a permanent resist for the substrate for a semiconductor device, as well as the external terminals having a thickness different from the internal terminals and the wiring portions are pre-provided in the openings in the permanent resist so that the internal terminals and the wiring portions are sealed with the permanent resist while only the external terminals are uncovered on the side of the top surface of the permanent resist. This configuration makes it unnecessary to provide an insulating layer having openings at connection faces with external members in the manufacturing process for a semiconductor device, to result in a reduced number of steps in the manufacturing process for a semiconductor device and improved productivity.

A detailed description will be made in this regard.

The inventors of the present application have conceived that the arrangement of electrical connection faces of internal terminals and external terminals of a substrate for semiconductor device used in manufacturing a semiconductor device should be inverted in reference to that of a conventional substrate for a semiconductor device.

That is, the conventional semiconductor device substrate is configured so that, when a semiconductor device is to be manufactured, the external terminal surface is used in a state of being uncovered on the side of the metal sheet and the internal terminal surface is used in a state of being uncovered on the side farther from the metal sheet.

In contrast, in the wiring member for a semiconductor device of the invention shown in FIG. 7A-7B, the plating layer that forms external terminals is configured to be higher, from a metal sheet that was used in manufacturing the substrate for semiconductor device, than the plating layers that form internal terminals and wiring portions, on the basis of the conception that, when a semiconductor device is to be manufactured, the external terminal surface is used in a state of being uncovered on the side farther from the metal sheet that was used in manufacturing the substrate for semiconductor device and the internal terminal surface is used in a state of being uncovered on the side of the metal sheet.

For example, when the metal sheet, which was used in manufacturing the wiring member for semiconductor device of the invention shown in FIGS. 7A-7B, is dissolved and removed by etching or the like, the faces of the first plating layer 11, which is to become internal terminals, on the metal-sheet-removal side are made uncovered at a uniform level (level difference of 1 μm or smaller) in conformance with the surface of the metal sheet. The metal sheet is a rolled material commonly used for lead frames.

Here, a semiconductor element is mounted on the first plating layer 11 as in the case of the semiconductor device using the conventional substrate for semiconductor device. Since the faces of the first plating layer 11 are uncovered at a uniform level, the connection surface is flat in its entirety, to assure stable connection.

In this case, the external terminals have to be uncovered at the faces farther from the metal sheet. Therefore, the inventors of the present application have devised the wiring member for semiconductor device of the invention shown in FIGS. 7A-7B in which the external terminals having a height different from the internal terminals and wiring portions are formed so that a permanent resist is formed on sites free from the second plating layer while leaving upper faces of the second plating layer uncovered with the metal sheet being removed by etching, by overlaying plating only on the sites where the external terminals are to be made after applying plating on the metal sheet at sites where the internal terminals, the wiring portions and the external terminals are to be formed.

As in the case of the wiring member for semiconductor device according to the invention shown in FIG. 7A-7B, in the configuration in which the external terminals have a difference in height from the internal terminals and the wiring portions so that only the internal terminals and the wiring portions are sealed with the permanent resist while only the external terminals are left uncovered on the side of the top surface of the permanent resist, it is possible to dispense with a step of removing the metal sheet by etching and a step of processing the permanent resist for forming openings at sites where faces for connection with external members are to be formed in the manufacturing process for semiconductor device, to result in a reduced number of steps and improved productivity.

Also, the wiring member for semiconductor device according to the invention shown in FIGS. 7A-7B is configured to include only the laminated plating film and the permanent resist, and thus, in resin-sealing after flip-chip mounting, only the permanent resist and the uncovered plating film of the wiring member for semiconductor device are sealed with a sealing resin, while a surface of a base material (metal sheet), which greatly differs in expansion coefficient from the resin, is not contacted with the sealing resin. Therefore, warpage after curing of the sealing resin is moderated. To be specific, in the case of resin-sealing of the permanent resist, since the permanent resist and the sealing resin are materials having similar physical characteristics, a difference between the two materials in thermal shrinkage or thermal expansion after curing of the sealing resin is smaller in comparison with the case of resin-sealing of the metal sheet forming a base material. In addition, no base material is removed after formation of the sealing resin portion. As a result, warpage after curing of the sealing resin is moderated.

Furthermore, according to the wiring member for semiconductor device of the invention shown in FIGS. 7A-7B, since removal of the metal sheet as a base material by etching and processes (application of solder resist, exposure, and development) for forming openings at connection faces with external equipment are dispensable in the manufacturing process for a semiconductor device, seeping-in moisture or liquid agent could not deteriorate the semiconductor device.

Problems Involved in the Invention Devised at the Stage before Introduction of the Present Invention Upon a further study and consideration, the inventors of the present application have found that the wiring member for semiconductor device of the invention shown in FIGS. 7A-7B had the following problems to be solved for responding to the demand for mass production.

Such a wiring member for semiconductor device as used for manufacturing semiconductor devices is formed as a multi-row wiring member for semiconductor devices in which individual wiring members for semiconductor devices are arrayed in a matrix, for the purpose of obtaining a large number of semiconductor devices at one time.

In the wiring member for semiconductor device shown in FIGS. 7A-7B, the internal terminals, the wiring portions and the external terminals are formed from the plating layers 11, 12 and 13 and are fixed by the permanent resist 15' with the wiring member in its entirety having a shape of a thin sheet. When a plurality of such wiring members for semiconductor devices as having a thin sheet shape are formed into a multi-row matrix, the area of the aggregate of wiring members for semiconductor devices comes to be enormously wide in reference to the thickness of the permanent resist. Therefore, the entire surface of the aggregate of wiring members for semiconductor devices easily causes deflection, which could unfavorably affect manufacturing of semiconductor devices. For example, when a sheet of an aggregate of multi-row substrates for semiconductor devices is to be conveyed for the purpose of carrying out the flip-chip mounting step in the state where a laminated plating film is buried in a permanent resist, since the sheet has too low a strength to be a sheet for mounting semiconductor elements thereon, it could be deformed during conveyance.

Function and Effect of the Present Invention

Then, upon repeated trial and error on the basis of study and consideration of the above-described problem in the invention shown in FIGS. 7A-7B, the inventors of the present application have devised the present invention, which can maintain the above-described advantage as well as can solve the above-described problem of the invention shown in FIGS. 7A-7B.

The multi-row wiring member for semiconductor device according to the embodiment mode of the present invention is configured of a plurality of such wiring members for semiconductor devices of the invention as shown in FIGS. 7A-7B arrayed in a matrix, wherein, on the bottom-surface side of the permanent resist, a metal frame portion is formed at a site that is to be a margin around an aggregate of individual wiring members for semiconductor devices arrayed in a matrix.

If a metal frame portion is formed on the bottom-surface side of the permanent resist at a site that is to be a margin around an aggregate of wiring members for semiconductor devices arrayed in a matrix as in the multi-row wiring member for semiconductor device according to the embodiment mode of the present invention, the metal frame portion reinforces the multi-row wiring member for semiconductor device, to assure a strength that makes the multi-row wiring member for semiconductor device hardly deformable even if conveyed.

It is noted that an aggregate of wiring members for semiconductor devices as a unit to be provided with a metal frame portion may be the entire region (one sheet) of the multi-row wiring member for semiconductor device or may be each of plurality of blocks into which the entire region is divided.

Also, in the multi-row wiring member for semiconductor device of the embodiment mode of the present invention, the plating layer that is to become wiring portions is formed on the first plating layer preferably with plating boundaries thereof coinciding with those of the first plating layer.

This structure allows a large area to be secured for internal terminals and thus the product is widely applicable to a variety of semiconductor elements different in pitch of electrodes.

Also, in the multi-row wiring member for semiconductor device of the embodiment mode of the present invention, the upper surface of the plating layer that is to become wiring portions formed on the first plating layer preferably is a roughened surface.

This structure improves adhesion between a site, in the plating layer that is to become wiring portions, not covered with the second plating layer and the permanent resist. Thus, even a thin plating layer having a thickness of 5 μm or less formed of the first plating layer and the plating layer that is to become wiring portions is prevented from coming off the permanent resist.

Also, in the multi-row wiring member for semiconductor device of the embodiment mode of the present invention, the bottom surface of the permanent resist, in which the first plating layer appears as uncovered, preferably is a rough surface.

This structure improves adhesion to an adhesive layer to be used in mounting a semiconductor element and to a sealing resin to be used for sealing after mounting of the semiconductor element.

The other configurations, functions and effects are substantially the same as the wiring member for semiconductor device of the invention shown in FIGS. 7A-7B.

The multi-row wiring member for semiconductor device according to the embodiment mode of the present invention can be manufactured by the method including: a step of forming, on a front surface of a metal sheet, a first resist mask having pattern-A openings and of forming, on a back surface of the metal sheet, a second resist mask having an opening at a site that is to be a margin around an aggregate of individual wiring members for semiconductor devices arrayed in a matrix; a step of forming, in the pattern-A openings, a first plating layer, which is to become internal terminals, and a plating layer that is to become wiring portions, connected with the first plating layer, and of forming, in the opening at the site that is to be the margin around the aggregate of individual wiring members for semiconductor devices arrayed in a matrix, a plating layer that is to become a resist for forming a metal frame portion; a step of peeling off the first resist mask and the second resist mask formed on the respective surfaces of the metal sheet; a step of forming, on a front-surface side of the metal sheet, a third resist mask made of a permanent resist having pattern-B openings that leave uncovered partial areas within areas of the plating layer that is to become the wiring portions and of forming a fourth resist mask made of a photosensitive resist covering an entirety of the back surface of the metal sheet; a step of forming a second plating layer, which is to become external terminals, in the pattern-B openings; a step of peeling off the fourth resist mask formed on the back surface of the metal sheet; and a step of removing by etching, from a back-surface side of the metal sheet, metal except a portion covered with the plating layer that is to become a resist for forming a metal frame portion in the site that is to become the margin around the aggregate of individual wiring members for semiconductor devices arrayed in a matrix.

The plating layer that is to become wiring portions is preferably formed on the first plating layer such that plating boundaries thereof coincides with those of the first plating layer.

This manner of formation allows a large area to be secured for internal terminals and thus the product is widely applicable to a variety of semiconductor elements different in pitch of electrodes.

Also, it is preferred that the upper surface of the plating layer that is to become wiring portions undergoes roughening treatment after formation of the plating layer that is to become wiring portions and before formation of the third resist mask or that the plating layer that is to become wiring portions is formed as a roughened plating layer.

Such a step improves adhesion between a site, in the plating layer that is to become wiring portions, not covered with the second plating layer and the permanent resist. Thus, even a thin plating layer having a thickness of 5 μm or less formed of the first plating layer and the plating layer that is to become wiring portions is prevented from coming off the permanent resist.

Also, it is preferred to include a step of carrying out roughening treatment of the surfaces of the metal sheet upon using, as a mask, the plating layer that is to become wiring portions formed on the metal sheet after removal of the first and second resist masks formed on the respective surfaces of the metal sheet.

This step improves adhesion between the surface of the metal sheet and the permanent resist as well as improves adhesion between the metal frame portion and the margin around the aggregate of wiring members for semiconductor devices.

Therefore, the embodiment mode of the present invention can provide a multi-row wiring member for semiconductor device that enables mass production of a highly-reliable resin-sealed semiconductor device with high yield through a reduced number of steps and a manufacturing method of the same multi-row wiring member for semiconductor device; the wiring member enables reduction in thickness and size of the semiconductor device, improves adhesion between a plating film that forms terminal portions and a resin, achieves uniform height of the internal terminal surface on which the semiconductor element is to be mounted and internal terminal portions to be electrically connected with the semiconductor element, eliminates, in the manufacturing process for the semiconductor device, the step of removing the metal sheet by etching and the step of forming openings that uncover external terminal portions alone, and moderating a warpage of the sealing resin as cured.

In reference to the drawings, the embodiment mode of the present invention will be described below.

First Embodiment Mode

Figure 1A:
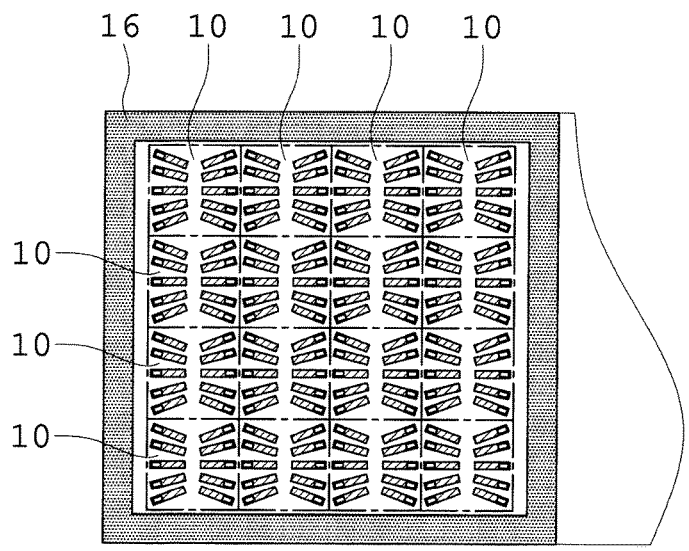
FIGS. 1A-1E are diagrams that show the configuration of the multi-row wiring member for semiconductor device according to the first embodiment mode of the present invention, where
Figure 1B:
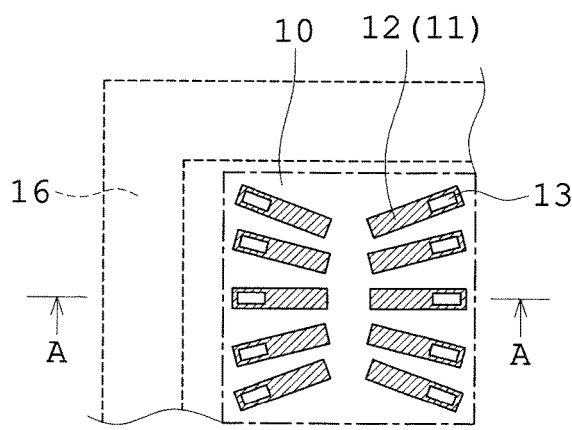
Figure 1D:
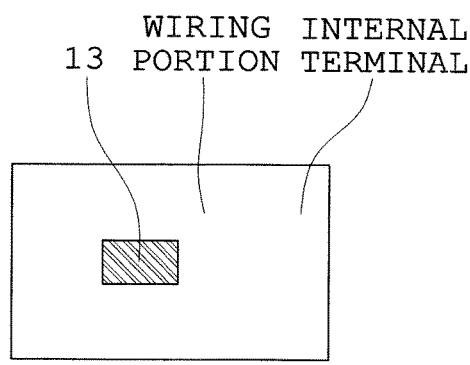
Figure 1C:
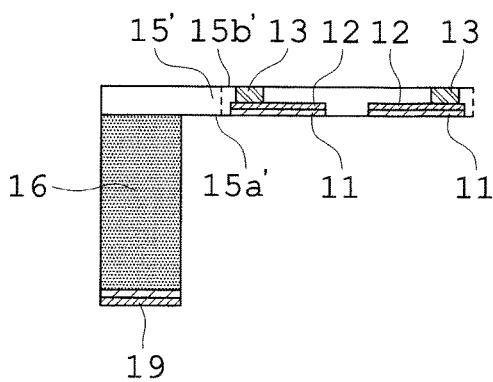
Figure 1E:
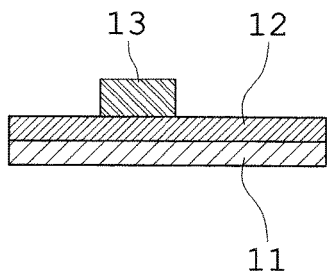

FIGS. 1A-1E are diagrams that show the configuration of the multi-row wiring member for semiconductor device according to the first embodiment mode of the present invention, where FIG. 1A is a plan view as viewed from the external-terminal side, FIG. 1B is an enlarged view of a part of FIG. 1A, FIG. 1C is a sectional view taken along A-A of FIG. 1B, FIG. 1D is a plan view that shows one example of a laminated piece of plating layers forming an internal terminal, a wiring portion and an external terminal in an individual wiring member for a semiconductor device, and FIG. 1E is a sectional view of FIG. 1D. FIGS. 2A-2J are explanatory diagrams that show the manufacturing process for the multi-row wiring member for semiconductor device shown in FIGS. 1A-1E. FIGS. 3A-3F are explanatory diagrams that show one example of the manufacturing process for a resin-sealed semiconductor device using the multi-row wiring member for semiconductor device of the first embodiment mode manufactured via the manufacturing process shown in FIGS. 2A-2J.

As shown in FIG. 1A, the multi-row wiring member for semiconductor device of the first embodiment mode has an aggregate of wiring members for semiconductor devices arrayed in a matrix and a metal frame portion 16.

As shown in FIG. 1C, individual wiring members 10 for semiconductor devices are configured to have a permanent resist 15', a first plating layer 11, which is to become internal terminals, a plating layer 12 that is to become wiring portions, and a second plating layer 13, which is to become external terminals.

The first plating layer 11, which is to become internal terminals, is formed in a permanent resist 15' with lower faces thereof being uncovered at predetermined sites in a bottom surface 15a' of the permanent resist 15' at a same level as the bottom surface 15a'.

The plating layer 12 that is to become wiring portions is formed in the permanent resist 15' on the first plating layer 11 with plating boundaries thereof coinciding with those of the first plating layer 11.

The upper surface of the plating layer 12 that is to become wiring portions is a roughened surface. Also, the bottom surface of the permanent resist 15', in which the first plating layer 11 appears as uncovered, is a rough surface.

The second plating layer 13, which is to become external terminals, is formed on partial areas within areas of the plating layer 12 that is to become wiring portions (for example, 0.03 mm or more inward from the plating boundaries of the plating layer 12 that is to become wiring portions), with upper faces thereof being uncovered on a top-surface 15b' side of the permanent resist 15'.

One example of the first plating layer 11 is configured of an Au plating layer, a Pd plating layer and a Ni plating layer overlaid one on another in this order.

The plating layer 12 that is to become wiring portions is configured of an Ni plating layer, Cu plating layer or the like.

One example of the second plating layer 13 is configured of a Ni plating layer, Pd plating layer and an Au plating layer overlaid one on another in this order.

The height H2 of the upper surface of the second plating layer 13 (that is, the upper surface of the Au plating layer) from the bottom surface 15a' of the permanent resist 15' is larger than the height H1 of the upper surface of the plating layer 12 that is to become wiring portions from the bottom surface 15a' of the permanent resist 15'.

A side view of each laminated piece formed of the plating layer 11, which is to become internal terminals, the plating layer 12 that is to become wiring portions, and the second plating layer 13, which is to become external terminals, substantially has an L shape (or an inverted T shape as shown in FIG. 1E).

The metal frame portion 16 is formed as closely attached to the back-surface 15a' side of the permanent resist 15' at the margin around an aggregate of the wiring members 10 for semiconductor devices.

The multi-row wiring member for semiconductor device of the first embodiment mode thus configured can be manufactured in the following manner or the like. It is noted that description of pre-treatment and post-treatment including chemical cleaning, aqueous washing and the like carried out in each step of the manufacturing is omitted for convenience's sake. In addition, FIGS. 2A-2J show the manufacturing process as if the metal frame portion should be formed around one wiring member for semiconductor device, for convenience's sake.

Figure 2A:
FIGS. 2A-2J are explanatory diagrams that show the manufacturing process for the multi-row wiring member for semiconductor device shown in FIGS. 1A-1E.
Figure 2B:
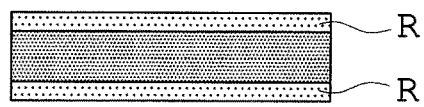

First, dry film resist R for a first resist mask and for a second resist mask is made to laminate respective sides of a metal sheet 1 serving as a substrate shown in FIG. 2A (see FIG. 2B).

Figure 2C:
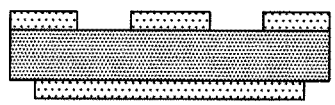

Next, the dry film resist R on the front surface side is exposed and developed upon use of a glass mask that carries a pattern (here, referred to as a pattern A) for forming, at predetermined sites, internal terminals, wiring portions and the stem of external terminals, as well as the dry film resist R on the back surface side is exposed and developed upon use of a glass mask that carries a pattern for forming a resist directed to formation of a metal frame portion at a site that is to be a margin around an aggregate of wiring members for semiconductor devices. Then, as shown in FIG. 2C, a first resist mask having pattern-A openings is formed on the front surface, and, on the back surface, there is formed a second resist mask having an opening at the site that is to be a margin around the aggregate of wiring members for semiconductor devices. It is noted that the exposure and development is carried out by a conventional known method. For example, dry film resist as covered with a glass mask is irradiated with ultraviolet rays, for lowering its solubility in a developer at sites irradiated with the ultraviolet rays passing through the glass mask and then removing the rest of the dry film resist other than these sites, to thereby form a resist mask. Here, while negative dry film resist is used as the resist, negative liquid resist may be used for formation of a resist mask. Further, dry film resist or liquid resist of positive type may be used, for increasing its solubility in a developer at sites irradiated with the ultraviolet rays passing through a glass mask and then removing these sites, to thereby form a resist mask.

Then, Au plating and Pd plating are respectively applied to the sites not covered with the first resist mask on the metal sheet, so that an Au plating layer and a Pd plating layer are formed in this order to have predetermined thicknesses respectively (for example, Au plating layer of 0.003 μm and Pd plating layer of 0.03 μm) as the first plating layer 11.

Figure 2D:
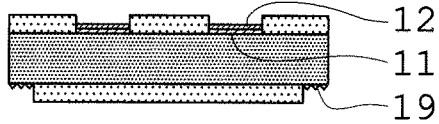

After that, Ni plating (or Cu plating) is applied to the Pd plating layer for about 4 μm, so that, as the plating layer 12 that is to become wiring portions, a Ni plating layer (or a Cu plating layer) is formed as having the same plating boundaries in a plan view as the first plating layer. Also, the Ni plating layer (or Cu plating layer) that is to become wiring portions preferably undergoes roughening treatment. FIG. 2D shows the state at this stage.

The total thickness of the laminated plating layer configured of the first plating layer 11 and the plating layer 12 that is to become wiring portions should be 5 μm or less. A plating thickness exceeding 5 μm is not preferable. When a third resist mask for forming the later-described second plating layer is formed to cover the first plating layer 11 and the plating layer 12 that is to become wiring portions, an excessive protrusion of the laminated plating layer from the metal sheet would allow easy entry of air in beneath the third resist mask.

At this time, a plating layer 19, which serves as a resist for formation of a metal frame portion and is configured of plating layers similar to those of the first plating layer 11 and the plating layer 12 that is to become wiring portions overlaid one on another, also is formed, on the back surface side of the metal sheet, in the opening at the site that is to be a margin around an aggregate of wiring members for semiconductor devices.

In the case where a Ni plating layer is formed as the plating layer 12 that is to become wiring portions, roughening treatment on the Ni plating layer is carried out by subjecting the surface of the Ni plating layer to etching. In the case where a Cu plating layer is formed as the plating layer 12 that is to become wiring portions, roughening treatment on the Cu plating layer is carried out by subjecting the surface of the Cu plating layer to anodizing treatment or etching.

The metal of which the plating layer on the semiconductor-element-mounting-surface side (i.e. nearest to the metal sheet) in the first plating layer 11 is made is appropriately selectable among Ni, Pd, Au, Ag, Sn, Cu and the like as one that is needed for flip-chip connection.

Figure 2E:
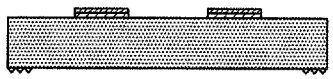

Then, the first resist mask and the second resist mask on the respective sides are peeled off (See FIG. 2E). Then, a permanent resist 15' made of solder resist is applied to the front surface of the metal sheet as well as dry film resist R2 is made to laminate the back surface of the metal sheet (See FIG. 2F). After peeling off of the first resist mask and the second resist mask formed on the respective surfaces of the metal sheet and before application of the permanent resist 15' to the front surface of the metal sheet, the front surface of the metal sheet preferably is subjected to roughening treatment upon use of the plating layer 12 that is to become wiring portions formed on the metal sheet as a mask.

Then, the permanent resist 15' on the front surface side is exposed and developed upon use of a glass mask that carries a pattern (here, referred to as a pattern B) for forming a plating layer to be additionally layered on sites that are to become external terminals within areas of the previously-formed plating layer that is to become wiring portions, and the dry film resist R2 on the back surface side is exposed and developed upon use of a glass mask that allows the entire surface to be exposed. Then, as shown in FIG. 2G, a third resist mask having pattern-B openings is formed of the permanent resist 15' on the front side, and a fourth resist mask covering the entire surface is formed on the back side.

Then, Ni plating, Pd plating and Au plating are sequentially applied to the surface not covered with the third resist mask, on the Ni plating layer (or Cu plating layer) constituting the plating layer 12 that is to become wiring portions, so that a Ni plating layer, a Pd plating layer and an Au plating layer arranged in this order in the second plating layer 13 have predetermined thicknesses respectively while the upper surface of the uppermost plating layer (Au plating layer) is lower than the upper surface of the third resist mask.

Figure 2F:
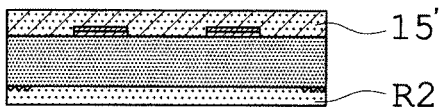
Figure 2G:
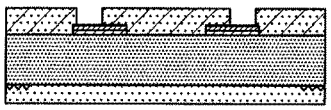
Figure 2H:
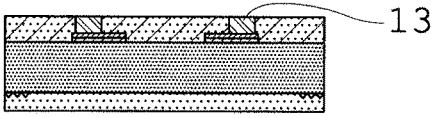

FIG. 2H shows this state. Preferably, each plating is carried out to form a concavity resulted from the upper surface of the uppermost plating layer being lower than the upper surface of the third resist mask by 3 to 13 μm. By doing so, when solder bonding with external equipment is to be made after the semiconductor device is mounted, the solder easily pools in the concavity and thus solder bleeding is avoided. The Ni plating layer is formed to have a thickness of 20 to 50 μm. Alternatively, Pd plating and Au plating may be applied, to provide a Pd plating layer and an Au plating layer in this order with respective predetermined thicknesses without providing the Ni plating layer. The metal of which the plating layer that is to become an external-terminal bonding surface in the second plating layer 13 is made is appropriately selectable among Ni, Pd, Au, Sn, and the like as one that can be solder-bonded to an external base material.

Figure 2I:
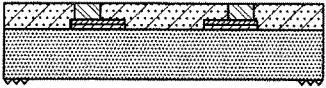

Then, the fourth resist mask on the back surface is peeled off (See FIG. 2I).

Figure 2J:
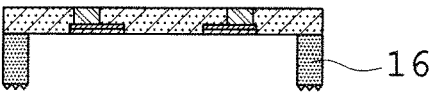

Then, the metal sheet is subjected to etching from the back-surface side to be removed by dissolution upon use of, as an etching resist, the plating layer 19 formed in the opening at the site that is to be a margin around an aggregate of wiring members for semiconductor devices, from a back-surface side of the metal sheet, so that, as shown in FIG. 2J, the surface of the first plating layer 11, which is to become internal terminals, is uncovered at the same level as the bottom surface 15a' of the permanent resist 15' as well as the metal frame portion 16 is formed around the aggregate of wiring members for semiconductor devices. Thereby, the multi-row wiring member for semiconductor device of this embodiment mode is completed.

Manufacturing of a semiconductor device using the wiring member for semiconductor device of the first embodiment mode thus manufactured is conducted as shown below. FIGS. 3A-3F are explanatory diagrams that show one example of the manufacturing process for a resin-sealed semiconductor device using the multi-row wiring member for semiconductor device of the first embodiment mode manufactured via the manufacturing process shown in FIGS. 2A-2J. FIGS. 4A-4B are diagrams that show the state where flip-chip mounting of a semiconductor element on the individual wiring member for semiconductor device is achieved in the manufacturing process shown in FIGS. 3A-3F, where FIG. 4A is a plan view as viewed from the semiconductor-element-mounting side, and FIG. 4B is a sectional view of FIG. 4A.

Figure 3A:
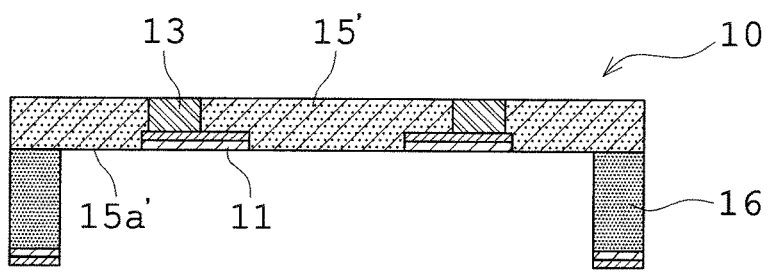
FIGS. 3A-3F are explanatory diagrams that show one example of the manufacturing process for a resin-sealed semiconductor device using the multi-row wiring member for semiconductor device of the first embodiment mode manufactured via the manufacturing process shown in FIGS. 2A-2J.
Figure 3B:
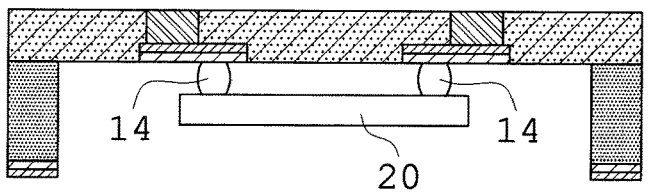
Figure 4A:
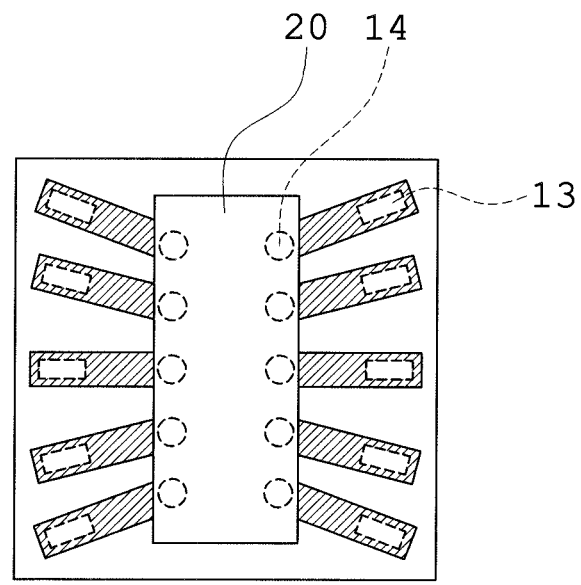
FIGS. 4A-4B are diagrams that show the state where flip-chip mounting of a semiconductor element on the individual wiring member for semiconductor device is achieved in the manufacturing process shown in FIGS. 3A-3F, where
Figure 4B:
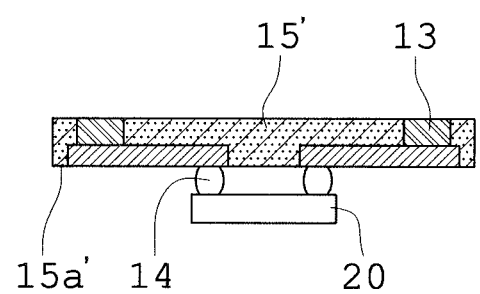
Figure 5A:
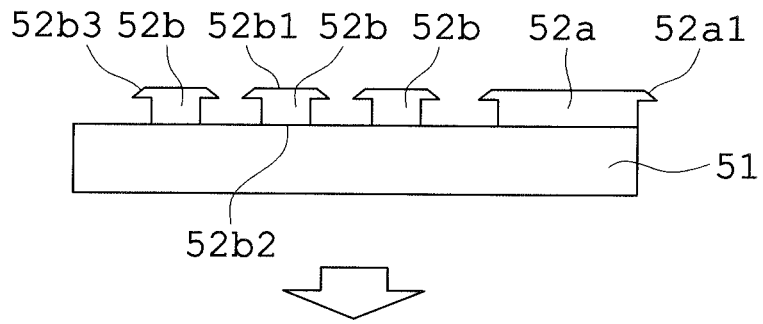
FIGS. 5A-5D are explanatory diagrams that show one example of the manufacturing process for semiconductor device using a conventional substrate for semiconductor device.
Figure 5B:
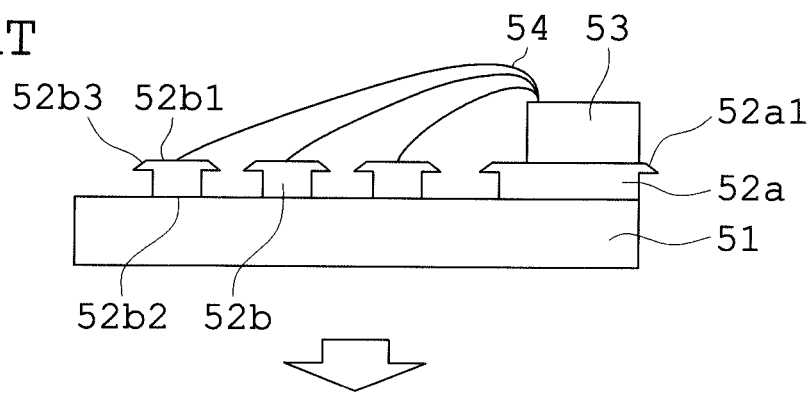
Figure 5C:
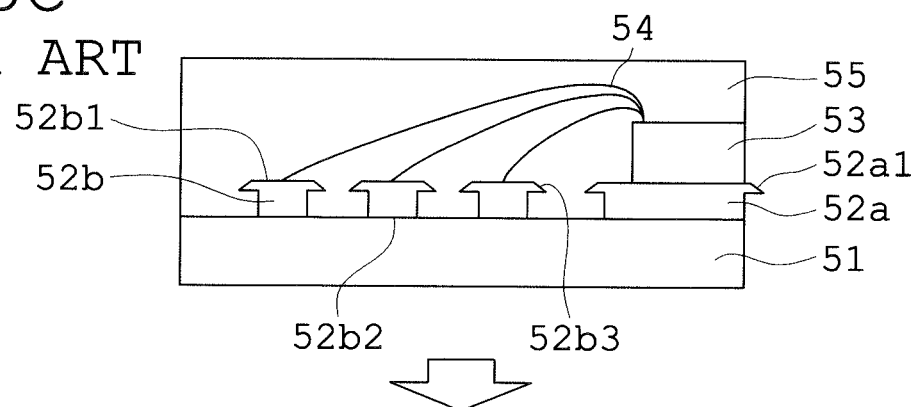
Figure 5D:
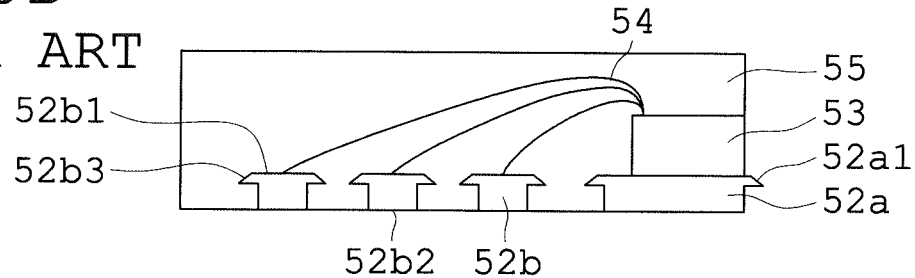
Figure 6A:
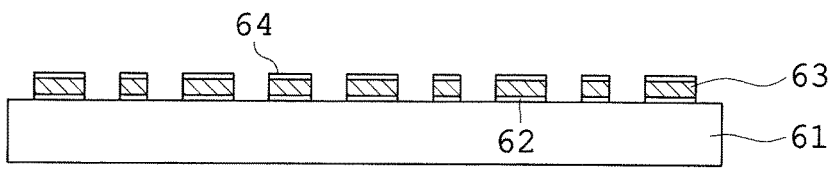
FIGS. 6A-6F are explanatory diagrams that show another example of the manufacturing process for semiconductor device using a conventional substrate for semiconductor device.
Figure 6B:
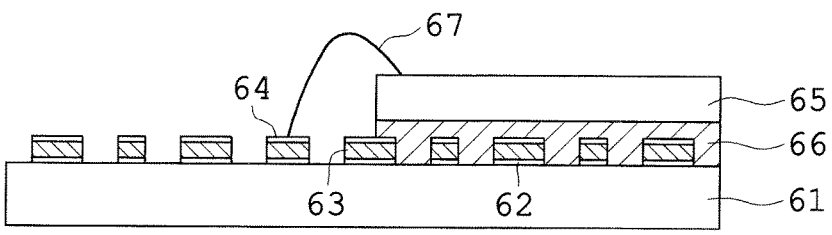
Figure 6C:
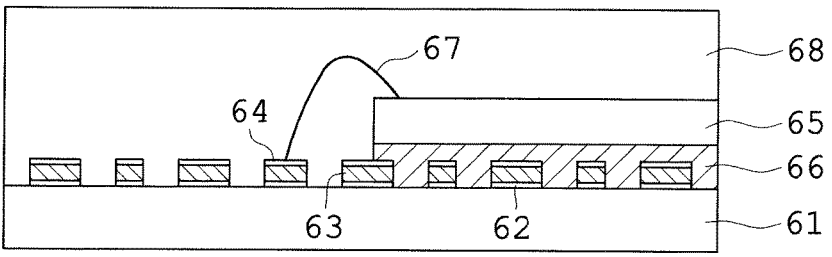
Figure 6D:
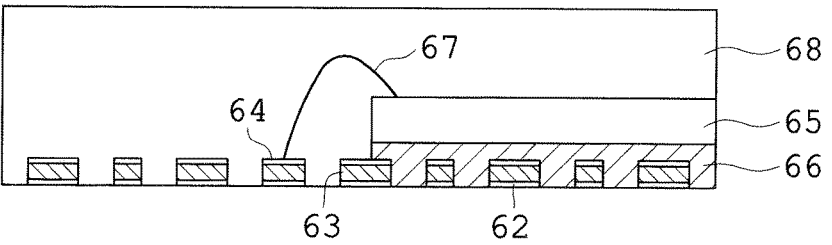
Figure 6E:
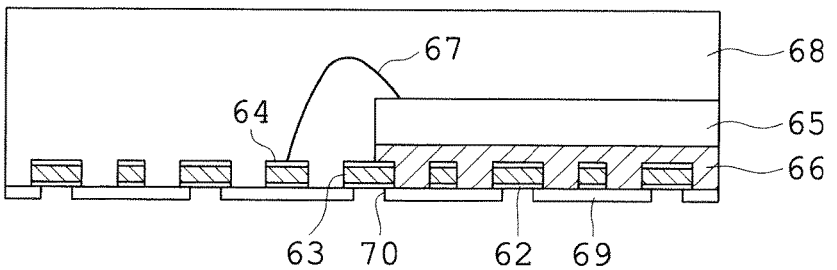
Figure 6F:
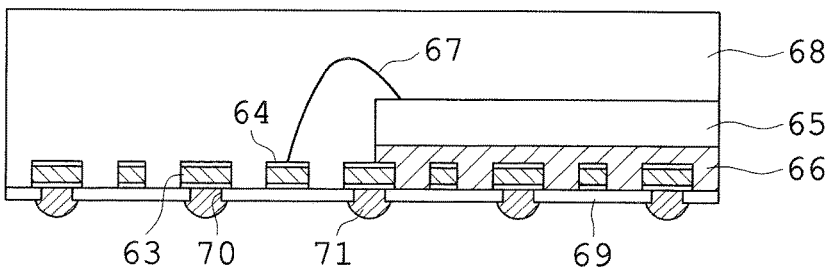

First, a semiconductor element 20 is mounted on the internal-terminal surface side of the wiring member for semiconductor device shown in FIG. 3A, and electrodes of the semiconductor element 20 are connected with the internal terminals, which are uncovered at the same level as the bottom surface 15a' of the permanent resist 15', via a solder ball 14 (See FIG. 3B, FIG. 4A and FIG. 4B). In the wiring member for semiconductor device of the first embodiment mode, since the surfaces of the internal terminals as uncovered are at the same level as the bottom surface 15a' of the permanent resist 15', the semiconductor element 20 can be stably mounted.

Figure 3C:
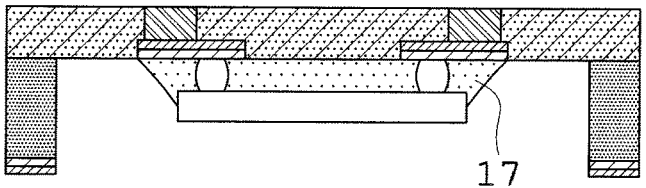

Then, a gap around the internal-terminal side of the semiconductor element 20 connected via the solder ball 14 is sealed with a predetermined sealing material 17 (See FIG. 3C).

Figure 3D:
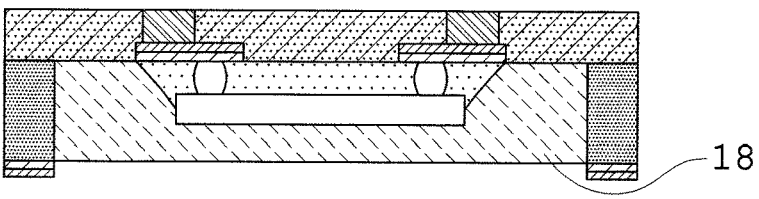

Then, the surface on which the semiconductor element 20 is mounted is sealed with a sealing resin 18 (See FIG. 3D).

Figure 3E:
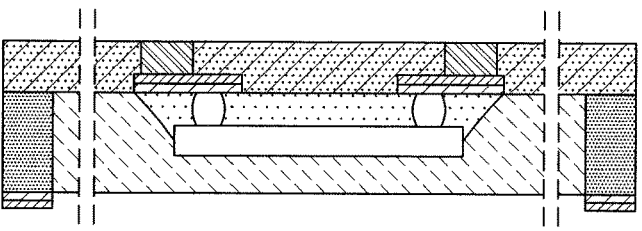
Figure 3F:
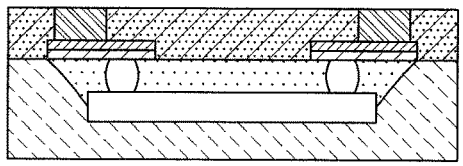

Then, cutting is made for individual semiconductor device regions (See FIG. 3E).

Thereby, the semiconductor device is completed. FIGS. 3A-3E are shown without changing the vertical direction of the wiring member for semiconductor device.

The semiconductor device as completed is mounted on an external member. In this case, since only the external terminals are left uncovered in reference to the resin, they can be easily connected with connecting terminals provided on the external member.

According to the multi-row wiring member for semiconductor device of the first embodiment mode, since the metal frame portion 16 is formed on the bottom surface 15a' of the permanent resist 15 at the margin around an aggregate of wiring members for semiconductor devices, the metal frame portion reinforces the multi-row wiring member for semiconductor device, to assure a strength that makes the multi-row wiring member for semiconductor device hardly deformable even if conveyed.

Also, according to the multi-row wiring member for semiconductor device of the first embodiment mode, since the individual wiring member for semiconductor device forms laminated pieces of plating layers 11, 12 and 13 in which the internal terminals and the external terminals are connected via the wiring portions, the respective mounting pitches of the internal terminals and the external terminals are adjustable in accordance with design.

Also, according to the multi-row wiring member for semiconductor device of the first embodiment mode, since each laminated piece of plating layers 11, 12 and 13 in which an internal terminal and an external terminal are connected via a wiring portion is formed to have substantially an L shape or an inverted T shape in a side view, adhesion to the permanent resist 15' is improved and thus prevents the metal film forming the terminals from coming off the permanent resist.

Also, according to the multi-row wiring member for semiconductor device of the first embodiment mode, since the configuration is made so that the second plating layer 13, which is to become external terminals, is formed on partial areas within areas of the plating layer 12 that is to become wiring portions, the second plating layer 13 can be made small and thus, as the external terminals left uncovered on the back side (upper side in FIG. 3F) of the semiconductor device, is prevented from dropping or coming off.

Also, according to the multi-row wiring member for semiconductor device of the first embodiment mode, in the case where the internal terminal and the external terminal are shaped into a rectangular having the same width in each laminated piece of the plating layers as shown in FIGS. 1D and 1E, a large area can be secured for the internal terminal and thus the product is widely applicable to a variety of semiconductor elements different in pitch of electrodes.

Also, according to the multi-row wiring member for semiconductor device of the first embodiment mode, the resin, which would be provided during the manufacturing process for a semiconductor device in the case of a conventional substrate for semiconductor device, is pre-provided in the form of a permanent resist for the substrate for a semiconductor device, as well as the external terminals having a thickness different from the internal terminals and the wiring portions are pre-provided in the openings in the permanent resist so that the internal terminals and the wiring portions are sealed with the permanent resist while only the external terminals are uncovered on the side of the top surface of the permanent resist. This configuration makes it unnecessary to remove the metal sheet by etching or to provide an insulating layer having openings at connection faces with external members in the manufacturing process for a semiconductor device, to result in a reduced number of steps in the manufacturing process for a semiconductor device and improved productivity.

Also, according to the first embodiment mode, the multi-row wiring member for semiconductor device is configured to include only the laminated plating film and the permanent resist, and thus, in resin-sealing after flip-chip mounting, only the permanent resist 15' and the uncovered plating film are sealed with a sealing resin 18, while the surface of the base material (metal sheet), which greatly differs in expansion coefficient from the resin, is not contacted with the sealing resin. Therefore, warpage after curing of the sealing resin is moderated. To be specific, in the case of resin-sealing of the permanent resist, since the permanent resist and the sealing resin are materials having similar physical characteristics, a difference between the two materials in thermal shrinkage or thermal expansion after curing of the sealing resin is smaller in comparison with the case of resin-sealing of the metal sheet forming a base material. In addition, no base material is removed after formation of the sealing resin portion. As a result, warpage after curing of the sealing resin is moderated.

Furthermore, according to the multi-row wiring member for semiconductor device of the first embodiment mode, since removal of the metal sheet as a base material by etching and processes (application of solder resist, exposure, and development) for forming openings at connection faces with external equipment are dispensable in the manufacturing process for a semiconductor device, seeping-in moisture or liquid agent could not deteriorate the semiconductor device.

Therefore, according to the first embodiment mode, there can be provided a multi-row wiring member for semiconductor device that enables mass production of a highly-reliable resin-sealed semiconductor device with high yield through a reduced number of steps and a manufacturing method for the same multi-row wiring member for semiconductor device; the wiring member enables reduction in thickness and size of the semiconductor device, improves adhesion between a plating film that forms terminal portions and a resin, achieves uniform height of the internal terminal surface on which the semiconductor element is to be mounted and internal terminal portions to be electrically connected with the semiconductor element, eliminates, in the manufacturing process for the semiconductor device, the step of removing the metal sheet by etching and the step of forming openings that uncover external terminal portions alone, and moderating a warpage of the sealing resin as cured.

Embodied Example

Next, description will be made of an embodied example of the multi-row wiring member for semiconductor device and the manufacturing method therefor.

Although pre-treatment and post-treatment including chemical cleaning, aqueous washing and the like were carried out in each step, they are common treatment and thus description is omitted.

First, a copper material having a thickness of 0.15 mm, which is for the use as a lead frame material also, was prepared as a metal sheet (See FIG. 2A).

In the step of forming a first resist mask and a second resist mask, dry film resist R having a thickness of 25 μm was made to laminate both surfaces of the metal sheet (see FIG. 2B).

Then, the dry film resist R on the front surface side was exposed and developed upon use of a glass mask carrying a pattern A for forming a plating at predetermined sites on the front surface side, to form a first resist mask having openings at the sites where the plating is to be formed. Regarding the dry film resist R on the back surface side, exposure and development were carried out upon use of a glass mask carrying a pattern for forming a resist directed to formation of a metal frame portion at a site that is to be a margin around an aggregate of wiring members for semiconductor devices, to form a second resist mask having an opening at the site corresponding to the margin around the aggregate of wiring members for semiconductor devices and covering the remaining sites. The exposure and development were carried out in the same manner as conventional one; the exposure of the dry film resist for transferring the respective patterns was carried out by, upon closely fitting a glass mask for exposure to the dry film resist, irradiating them with ultraviolet rays, and the development was carried out with sodium carbonate (See FIG. 2C).

In the next plating step, after a common pre-treatment for plating, the metal sheet free from covering by the first and second resist masks on the respective sides was plated so that Au of 0.01 μm, Pd of 0.03 μm, and Ni of 4.0 μm were formed in this order (See FIG. 2D).

Then, the first and second resist masks on the respective surfaces were peeled off (See FIG. 2E), and a permanent resist 15' formed of solder resist was applied to the front surface of the metal sheet, as well as dry film resist was made to laminate the back surface (see FIG. 2F). At that time, it was necessary to select the thickness of the resist according to the thickness of the second plating layer to be formed. In this embodied example, since the second plating layer was to be formed to have a thickness of 15 to 40 μm, a resist having a thickness of 50 μm was used only for the front surface side so that the uppermost surface of the plating layers is below the upper surface of the second resist mask, and a resist having a thickness of 25 μm was used for the back surface side.

Then, a third resist mask was formed by exposure and development upon use of a glass mask that carried a pattern B for forming a plating that is to be additionally layered on sites that were within the previously-formed plating layer and that were to become external terminals (See FIG. 2G). A resist mask 4 covering the entire surface was formed on the back surface side.

In the next plating step, an Ni plating surface free from covering by the third resist mask as formed was plated so that Ni of 20.0 μm, Pd of 0.03 μm, and Au of 0.01 μm were formed in this order (see FIG. 2H), and then the fourth resist mask on the back side was removed (see FIG. 2I).

Then, the metal sheet free from covering by any plating layer was removed by etching from the back side upon use of, as an etching resist, the plating layer 19, which had been formed in the opening in the second resist mask at the margin around the aggregate of wiring members for semiconductor devices on the back surface of the metal sheet 1 (copper material). As a result, a multi-row wiring member for semiconductor device provided with a metal frame portion 16 formed around the margin of an aggregate of wiring members for semiconductor devices was fabricated (See FIG. 2J).

Then, a semiconductor element was mounted on the side that had once adjoined the metal sheet, to establish electrical conduction with the internal terminals with the plating layer fixed by the permanent resist 15' of the multi-row wiring member for semiconductor device as completed being used as a wiring (see FIG. 3B), the semiconductor-element-mount portion was resin-sealed (See FIG. 3D), and cutting was made for individual semiconductor device regions. Thereby obtained was a semiconductor device in which faces of the external terminals were free from covering by the surface 15b' of the permanent resist 15' (see FIG. 3E).

Although the embodiment mode and the embodied example of the multi-row wiring member for semiconductor device are described above, the multi-row wiring member for semiconductor device is not limited to the configuration of the above-described embodiment mode and the embodied example.

For example, in the multi-row wiring member for semiconductor device of the first embodiment mode, used for the first plating layer are Au and Pd, used for the plating layer that is to become wiring portions is Ni, used for the second plating layer is Ni, Pd and Au. However, the combination of the plating used for forming the first plating layer, the plating layer that is to become wiring portions, and the second plating layer is not limited thereto. As modified examples, the multi-row wiring member for semiconductor device according to the present invention may be configured by combining the first plating layer, the plating layer that is to become wiring portions, and the second plating layer formed by plating as shown in the following Table 1. In Table 1, plating is shown as being applied in order from the top of the column in each modified example.

TABLE 1

Combination of Plating Constituting Wiring Member for Semiconductor Device

| | Modified Example | | | | | | | | |
|---|---|---|---|---|---|---|---|---|---|
| | 1 | 2 | 3 | 4 | 5 | 6 | 7 | 8 | 9 |
| 1st Plating Layer | Au | Ag | Au Pd | Au | Ag | Au Pd | Ag Pd | Pd | Pd |
| Plating Layer That Is To Become Wiring Portions | Ni | Ni | Ni | Ni | Ni | Ni | Ni | Ni | Ni |
| 2nd Plating Layer | Au | Au | Au | Pd Au | Pd Au | Pd Au | Au | Au | Pd Au |

What is claimed is:

1. A multi-row wiring member for semiconductor device configured of a plurality of wiring members for semiconductor devices arrayed in a matrix including:
a permanent resist;
a first plating layer, which is to become internal terminals, formed in the permanent resist with lower faces thereof being uncovered at predetermined sites in a bottom surface of the permanent resist;
a plating layer that is to become wiring portions, connected with the first plating layer in the permanent resist; and
a second plating layer, which is to become external terminals, formed, in the permanent resist on partial areas on areas of the plating layer that is to become wiring portions, with upper faces thereof being uncovered on a top-surface side of the permanent resist,
wherein a side view of each grouping of plating layers, that include one of the internal terminals, one of the wiring portions, and one of the external terminals, substantially has an L shape or an inverted T shape, and
wherein, on a bottom-surface side of the permanent resist, a metal frame portion is formed at a site that is to be a margin around an aggregate of individual wiring members for semiconductor devices arrayed in a matrix.

2. The multi-row wiring member for semiconductor device according to claim 1,
wherein the plating layer that is to become wiring portions is formed on the first plating layer with plating boundaries thereof coinciding with plating boundaries of the first plating layer.

3. The multi-row wiring member for semiconductor device according to claim 2,
wherein an upper surface of the plating layer that is to become wiring portions formed on the first plating layer is a roughened surface.

4. The multi-row wiring member for semiconductor device according to claim 1,
wherein a bottom surface of the permanent resist in which the first plating layer is left uncovered is a rough surface.

5. A method for manufacturing a multi-row wiring member for semiconductor device configured of a plurality of wiring members for semiconductor devices arrayed in a matrix including:
a step of forming, on a front surface of a metal sheet, a first resist mask having pattern-A openings and of forming, on a back surface of the metal sheet, a second resist mask having an opening at a site that is to be a margin around an aggregate of individual wiring members for semiconductor devices arrayed in a matrix;
a step of forming, in the pattern-A openings, a first plating layer, which is to become internal terminals, and a plating layer that is to become wiring portions, connected with the first plating layer, and of forming, in the opening at the site that is to be the margin around the aggregate of individual wiring members for semiconductor devices arrayed in a matrix, a plating layer that is to become a resist for forming a metal frame portion;
a step of peeling off the first resist mask and the second resist mask formed on the respective surfaces of the metal sheet;
a step of forming, on a front-surface side of the metal sheet, a third resist mask made of a permanent resist having pattern-B openings that leave uncovered partial areas within areas of the plating layer that is to become wiring portions and of forming a fourth resist mask made of a photosensitive resist covering an entirety of the back surface of the metal sheet;
a step of forming a second plating layer, which is to become external terminals, in the pattern-B openings;
a step of peeling off the fourth resist mask formed on the back surface of the metal sheet; and
a step of removing by etching, from a back-surface side of the metal sheet, metal except a portion covered with the plating layer that is to become a resist for forming a metal frame portion at the site that is to become the margin around the aggregate of individual wiring members for semiconductor devices arrayed in a matrix.

6. The method for manufacturing a multi-row wiring member for semiconductor device according to claim 5,
wherein the plating layer that is to become wiring portions is formed on the first plating layer to have plating boundaries coinciding with plating boundaries of the first plating layer.

7. The method for manufacturing a multi-row wiring member for semiconductor device according to claim 5,
wherein an upper surface of the plating layer that is to become wiring portions undergoes roughening treatment after formation of the plating layer that is to become wiring portions and before formation of the third resist mask or
the plating layer that is to become wiring portions is formed as a roughened plating layer.

8. The method for manufacturing a multi-row wiring member for semiconductor device according to claim 5, further comprising a step of carrying out roughening treatment of the surface of the metal sheet upon using, as a mask, the plating layer that is to become wiring portions formed on the metal sheet after removal of the first resist mask and the second resist mask formed on the respective surfaces of the metal sheet.

* * * * *